(12) United States Patent
Sekiya (10) Patent No.: US 10,446,403 B2
(45) Date of Patent: Oct. 15, 2019

(54) WAFER PROCESSING METHOD AND CUTTING APPARATUS

(71) Applicant: DISCO CORPORATION, Tokyo (JP)

(72) Inventor: Kazuma Sekiya, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 15/790,288

(22) Filed: Oct. 23, 2017

(65) Prior Publication Data

US 2018/0114697 A1 Apr. 26, 2018

(30) Foreign Application Priority Data

Oct. 25, 2016 (JP) .................................. 2016-208313

(51) Int. Cl.
| | | |
|---|---|---|
| *H01L 21/304* | (2006.01) | |
| *H01L 21/67* | (2006.01) | |
| *H01L 21/78* | (2006.01) | |
| *H01L 23/544* | (2006.01) | |
| *H01L 21/683* | (2006.01) | |

(52) U.S. Cl.
CPC .... *H01L 21/3043* (2013.01); *H01L 21/67092* (2013.01); *H01L 21/67259* (2013.01); *H01L 21/78* (2013.01); *H01L 23/544* (2013.01); *H01L 21/6836* (2013.01); *H01L 2221/68327* (2013.01)

(58) Field of Classification Search
CPC ......... H01L 21/78–786; H01L 21/3043; H01L 21/67259–67265; H01L 21/6836; H01L 21/68707; H01L 23/544
See application file for complete search history.

(56) References Cited

U.S. PATENT DOCUMENTS

| | | | | |
|---|---|---|---|---|
| 4,139,942 A | * | 2/1979 | Sastri ...................... | B26B 21/54 204/192.15 |
| 5,226,403 A | * | 7/1993 | Toyama ................ | B23D 59/001 125/13.01 |
| 5,480,754 A | * | 1/1996 | Takei .................... | G03G 5/0525 430/131 |
| 6,156,472 A | * | 12/2000 | Segi .................... | G03G 5/08214 430/127 |
| 6,354,909 B1 | * | 3/2002 | Boucher .............. | B23D 59/002 125/12 |
| 6,371,100 B2 | * | 4/2002 | Sekiya ................. | B28D 5/0064 125/13.01 |
| 6,461,524 B1 | * | 10/2002 | Tsuihiji ................ | B01D 25/164 210/777 |

(Continued)

FOREIGN PATENT DOCUMENTS

| | | | | |
|---|---|---|---|---|
| JP | 03-131026 A | * | 6/1991 | ......... H01L 21/3043 |
| JP | 03131026 A | * | 6/1991 | ........... H01L 21/304 |

(Continued)

*Primary Examiner* — Maliheh Malek
(74) *Attorney, Agent, or Firm* — Greer Burns & Crain, Ltd.

(57) ABSTRACT

A wafer processing method for processing a wafer having, on a face side, a device formed in each of areas demarcated by a plurality of crossing projected cutting lines includes a holding step of holding the wafer on a chuck table with the face side exposed and a cutting step of cutting the wafer held on the chuck table along the projected cutting lines with a cutting blade. In the cutting step, cutting is carried out while cutting water with a low resistivity is supplied to the face side of the wafer and cutting water with a high resistivity is supplied to the cutting blade.

12 Claims, 5 Drawing Sheets

(56) References Cited

U.S. PATENT DOCUMENTS

| | | | | |
|---|---|---|---|---|
| 6,561,066 B2* | 5/2003 | Sekiya | B23D 59/002 | 125/13.01 |
| 6,568,385 B2* | 5/2003 | Sekiya | B23Q 11/0816 | 125/13.01 |
| 6,945,521 B2* | 9/2005 | Yoshida | B01F 3/04985 | 261/76 |
| 8,883,701 B2* | 11/2014 | Tamboli | B28D 5/0076 | 438/460 |
| 9,314,895 B2* | 4/2016 | Mori | B24B 7/228 | |
| 9,620,355 B2* | 4/2017 | Ryo | H01L 21/02076 | |
| 9,806,057 B2* | 10/2017 | Sekiya | H01L 24/97 | |
| 9,831,381 B2* | 11/2017 | Yoshida | H01L 33/0095 | |
| 9,847,257 B2* | 12/2017 | Ohura | H01L 21/6838 | |
| 9,925,619 B2* | 3/2018 | Hirata | B23K 26/0057 | |
| 2002/0063345 A1 | 5/2002 | Kambe | B01D 61/00 | 261/102 |
| 2002/0081776 A1* | 6/2002 | Tellkamp | B23D 61/026 | 438/113 |
| 2004/0121562 A1* | 6/2004 | Wakui | H01L 21/78 | 438/465 |
| 2004/0137700 A1* | 7/2004 | Sekiya | B28D 5/0064 | 438/460 |
| 2004/0209443 A1* | 10/2004 | Cadieux | B28D 5/0076 | 438/460 |
| 2005/0006313 A1* | 1/2005 | Swinnen | C02F 1/36 | 210/748.03 |
| 2005/0051913 A1* | 3/2005 | Yoshida | B01F 3/04985 | 261/76 |
| 2006/0164617 A1* | 7/2006 | Nagahashi | G03F 7/70341 | 355/53 |
| 2006/0175208 A1* | 8/2006 | Eickhoff | G01N 27/4162 | 205/783 |
| 2007/0272545 A1* | 11/2007 | Miyagi | H01L 21/02052 | 204/198 |
| 2009/0001315 A1* | 1/2009 | Ishikawa | C03C 15/00 | 252/79.5 |
| 2009/0042368 A1* | 2/2009 | Sekiya | H01L 21/3065 | 438/460 |
| 2009/0098711 A1* | 4/2009 | Sekiya | B81C 1/00873 | 438/460 |
| 2009/0120457 A1* | 5/2009 | Naghshineh | C11D 3/3947 | 134/2 |
| 2009/0196989 A1* | 8/2009 | Katayama | B24D 99/00 | 427/202 |
| 2009/0209066 A1* | 8/2009 | Sekiya | H01L 21/67132 | 438/114 |
| 2010/0009517 A1* | 1/2010 | Collier | B28D 5/0076 | 438/460 |
| 2010/0282617 A1* | 11/2010 | Rothberg | C12Q 1/6825 | 205/780.5 |
| 2010/0311225 A1* | 12/2010 | Sekiya | H01L 21/78 | 438/463 |
| 2011/0097852 A1* | 4/2011 | Sekiya | B24B 1/00 | 438/114 |
| 2011/0124181 A1* | 5/2011 | Suzuki | B28D 5/0011 | 438/464 |
| 2011/0175243 A1* | 7/2011 | Jo | H01L 21/0212 | 257/798 |
| 2011/0212574 A1* | 9/2011 | Sekiya | H01L 21/561 | 438/113 |
| 2011/0244612 A1* | 10/2011 | Sekiya | B28D 5/0011 | 438/33 |
| 2011/0256689 A1* | 10/2011 | Sekiya | B28D 5/0011 | 438/462 |
| 2011/0304007 A1* | 12/2011 | Watanabe | H01L 21/78 | 257/506 |
| 2012/0009762 A1* | 1/2012 | Tamboli | B28D 5/0076 | 438/460 |
| 2012/0047047 A1* | 2/2012 | Sekiya | G06Q 10/087 | 705/27.1 |
| 2012/0156858 A1* | 6/2012 | Sekiya | B23K 26/0063 | 438/458 |
| 2012/0244649 A1* | 9/2012 | Sano | B24B 37/0053 | 438/17 |
| 2013/0200528 A1* | 8/2013 | Lin | H01L 21/76877 | 257/774 |
| 2013/0203237 A1* | 8/2013 | Yamaguchi | H01L 21/78 | 438/460 |
| 2013/0300045 A1* | 11/2013 | Komatsu | B23Q 3/088 | 269/21 |
| 2013/0330855 A1* | 12/2013 | Sekiya | H01L 33/60 | 438/27 |
| 2013/0330856 A1* | 12/2013 | Sekiya | H01L 33/60 | 438/27 |
| 2013/0330857 A1* | 12/2013 | Sekiya | H01L 33/58 | 438/27 |
| 2014/0073224 A1* | 3/2014 | Yamashita | H01L 21/302 | 451/29 |
| 2014/0120699 A1* | 5/2014 | Hua | H01L 21/02076 | 438/463 |
| 2014/0170835 A1* | 6/2014 | Tamboli | B28D 5/0076 | 438/460 |
| 2014/0311471 A1* | 10/2014 | Gadd | B28D 5/0076 | 125/13.01 |
| 2015/0072507 A1* | 3/2015 | Sekiya | H01L 21/304 | 438/462 |
| 2015/0155205 A1* | 6/2015 | Iwasaki | H01L 24/83 | 438/113 |
| 2015/0158137 A1* | 6/2015 | Mori | B24B 7/228 | 451/73 |
| 2015/0170988 A1* | 6/2015 | Watanabe | H01L 23/552 | 257/659 |
| 2015/0262971 A1* | 9/2015 | Sekiya | H01L 24/97 | 438/107 |
| 2015/0283670 A1* | 10/2015 | Tsuno | B24B 53/007 | 134/23 |
| 2016/0061183 A1* | 3/2016 | Orij | F03B 13/264 | 415/141 |
| 2016/0099176 A1* | 4/2016 | Matsuzaki | H01L 33/0095 | 438/464 |
| 2016/0136771 A1* | 5/2016 | Fuwa | B24B 5/00 | 451/28 |
| 2016/0141209 A1* | 5/2016 | Takano | H01L 21/3046 | 257/620 |
| 2016/0193691 A1* | 7/2016 | Hirata | B23K 26/0057 | 225/2 |
| 2016/0228983 A1* | 8/2016 | Hirata | B23K 26/0057 | |
| 2016/0228984 A1* | 8/2016 | Hirata | B23K 26/0057 | |
| 2016/0228985 A1* | 8/2016 | Hirata | B23K 26/0057 | |
| 2016/0263627 A1* | 9/2016 | Uchida | H01L 21/67017 | |
| 2016/0307851 A1* | 10/2016 | Ohura | H01L 21/78 | |
| 2016/0311127 A1* | 10/2016 | Itatani | B26D 7/088 | |
| 2017/0025269 A1* | 1/2017 | Ryo | H01L 21/02076 | |
| 2017/0033007 A1* | 2/2017 | Ohura | H01L 21/78 | |
| 2017/0077347 A1* | 3/2017 | Yoshida | H01L 33/0095 | |
| 2017/0103919 A1* | 4/2017 | Kim | H01L 21/76898 | |
| 2017/0103920 A1* | 4/2017 | Sekiya | H01L 21/304 | |
| 2017/0154768 A1* | 6/2017 | Zhao | H01L 21/02076 | |
| 2017/0186635 A1* | 6/2017 | Sekiya | H01L 21/67336 | |
| 2017/0243787 A1* | 8/2017 | Sekiya | H01L 21/67028 | |
| 2017/0278759 A1* | 9/2017 | Sukegawa | H01L 22/14 | |
| 2017/0330799 A1* | 11/2017 | Sekiya | H01L 21/02013 | |
| 2017/0368636 A1* | 12/2017 | Ryo | B23K 26/18 | |
| 2017/0370845 A1* | 12/2017 | Ito | G01N 21/6456 | |
| 2018/0076016 A1* | 3/2018 | Nishihara | H01L 21/304 | |
| 2018/0076088 A1* | 3/2018 | Sandoh | H01L 21/78 | |
| 2018/0076784 A1* | 3/2018 | Sekiya | H03H 3/02 | |
| 2018/0096892 A1* | 4/2018 | Sandoh | H01L 21/78 | |
| 2018/0096952 A1* | 4/2018 | Miccoli | H01L 23/562 | |
| 2018/0097564 A1* | 4/2018 | Sekiya | H04B 10/1143 | |
| 2018/0099373 A1* | 4/2018 | Sekiya | B24B 37/30 | |
| 2018/0099377 A1* | 4/2018 | Sekiya | B24B 53/02 | |
| 2018/0102268 A1* | 4/2018 | Sekiya | H01L 21/67288 | |

(56) References Cited

U.S. PATENT DOCUMENTS

2018/0108565 A1* 4/2018 Sekiya .............. H01L 21/76894
2018/0133930 A1* 5/2018 Kaneko .................. B28D 7/046

FOREIGN PATENT DOCUMENTS

| JP | 04-370951 A | * 12/1992 | ......... H01L 21/3043 |
| JP | 04370951 A | * 12/1992 | ............. H01L 21/78 |
| JP | 2000-129044 | 7/2000 | |
| JP | 2000-198044 | 7/2000 | |

* cited by examiner

WAFER PROCESSING METHOD AND CUTTING APPARATUS

BACKGROUND OF THE INVENTION

Field of the Invention

The present invention relates to a wafer processing method and a cutting apparatus for cutting a wafer with a cutting blade, the wafer having a plurality of devices formed on the face side thereof.

Description of the Related Art

A cutting apparatus carries out cutting of a wafer or other workpiece by cutting into the workpiece with a cutting blade rotating at high speed. Cutting is normally conducted while supplying cutting water, thereby cooling the cutting blade and the workpiece or washing out cutting dust for removal from the workpiece.

During the cutting, there is a problem such that static electricity develops during cutting because of friction between the fast-rotating cutting blade and the cutting water, resulting in devices suffering electrostatic breakdown or cutting dust adhering to devices. This problem is dealt with by using cutting water with a resistivity lower than that of pure water, which is prepared by blowing carbon dioxide into pure water, thereby allowing static electricity to escape quickly from the workpiece, preventing charging of the devices, avoiding electrostatic breakdown thereof and keeping the devices free from adhesion of contaminants.

SUMMARY OF THE INVENTION

However, reducing the resistivity of pure water by blowing carbon dioxide thereinto as described above and carrying out cutting while supplying cutting water with a low resistivity to the cutting blade may lead to corrosion of the cutting blade due to the cutting water, resulting in a shorter life thereof. Shorter life of the cutting blade translates into frequent replacement thereof, leading to lower workability and higher manufacturing cost of the device chips.

It is therefore an object of the present invention to provide a wafer processing method and a cutting apparatus capable of preventing reduced life of a cutting blade.

In accordance with an aspect of the present invention, there is provided a wafer processing method for processing a wafer, the wafer having, on a face side, a device formed in each of areas demarcated by a plurality of crossing projected cutting lines, the wafer processing method including: a holding step of holding the wafer on a chuck table with the face side exposed, and a cutting step of cutting the wafer held on the chuck table along the projected cutting lines with a cutting blade. In the cutting step, cutting is carried out while cutting water with a low resistivity is supplied to the face side of the wafer and cutting water with a high resistivity is supplied to the cutting blade.

In accordance with another aspect of the present invention, there is provided a cutting apparatus including: a chuck table for holding a wafer having a plurality of devices; and a cutting blade for cutting the wafer held on the chuck table, the cutting apparatus further including: low resistivity cutting water supply means for supplying cutting water with a low resistivity to the face side of the wafer; and high resistivity cutting water supply means for supplying cutting water with a high resistivity to the cutting blade.

According to the wafer processing method of the present invention, cutting water with a low resistivity is supplied to the wafer during cutting, and cutting water with a resistivity higher than cutting water supplied to the wafer is supplied to the cutting blade. This prevents charging of the devices and also prevents corrosion of the cutting blade, thereby preventing reduced life of the cutting blade. Accordingly, the cutting blade life remains intact, thereby preventing aggravation of workability resulting from frequent replacement of the cutting blade and contributing to reduced possibility of high manufacturing cost.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Figure 1:
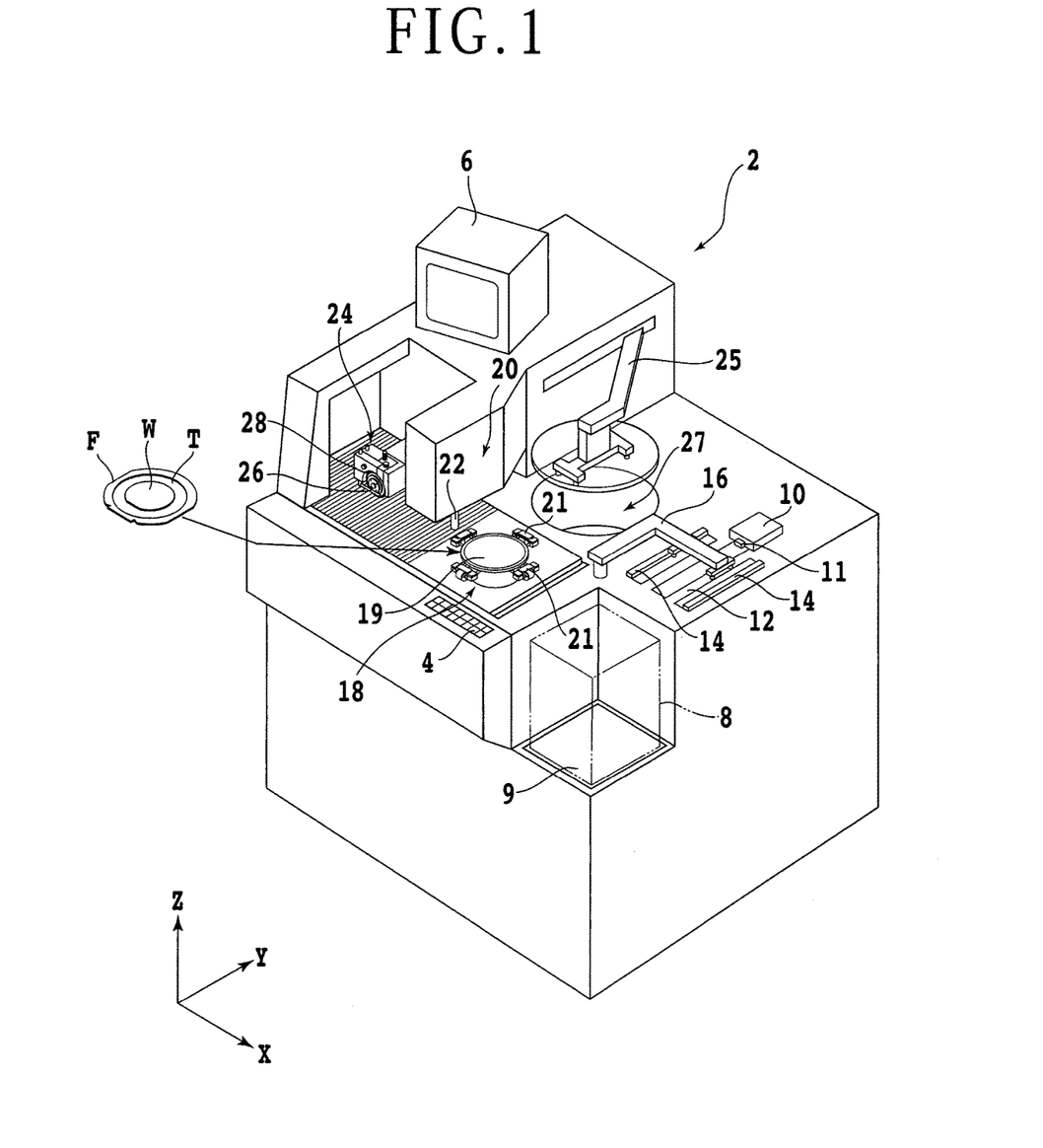
FIG. 1 is a perspective view of a cutting apparatus.

Preferred embodiments of the present invention will now be described in detail with reference to the drawings. Referring to FIG. 1, there is depicted a perspective view of a cutting apparatus having a blade cover according to a first embodiment. The cutting apparatus 2 has an operation panel 4, provided at the front thereof, for an operator to input instructions about processing and other conditions into the cutting apparatus. The cutting apparatus 2 has a display unit 6 such as a cathode ray tube (CRT), provided on the top thereof, for displaying a guidance screen for operators and an image captured by an imaging unit which will be described later.

Figure 3:
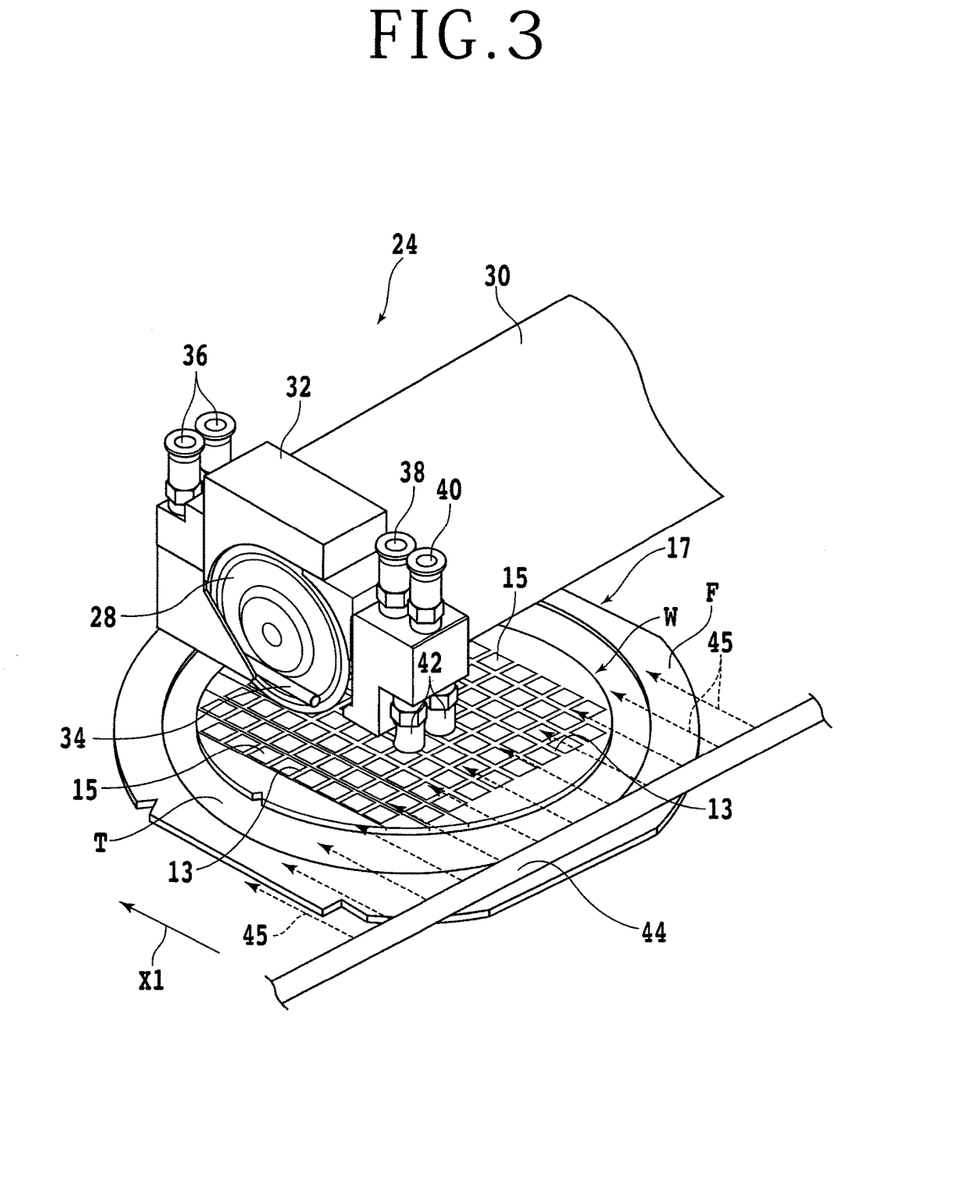
FIG. 3 is a perspective view depicting a cutting step of a first embodiment.

As depicted in FIG. 3, there are formed a plurality of projected cutting lines 13 in a lattice pattern on the front face of a target semiconductor wafer (hereinafter may be simply abbreviated as "wafer") W, with a device 15 formed in each of areas partitioned by the projected cutting lines 13. The wafer W is attached to a dicing tape T, an adhesive tape, forming a frame unit 17 having a perimeter of the dicing tape T attached to an annular frame F. A storage cassette 8 depicted in FIG. 1 accommodates the plurality of frame units 17 (e.g., 25 frame units). The storage cassette 8 is placed on a cassette elevator 9 that can move up and down.

There is disposed a loading/unloading unit 10 at the back of the storage cassette 8 to unload the uncut wafer W from the storage cassette 8 and load the cut wafer W into the storage cassette 8. The loading/unloading unit 10 has a clamp 11 for gripping the annular frame F of the frame unit 17, thereby allowing the frame unit 17 to be unloaded from and loaded into the storage cassette 8. The loading/unloading unit 10 is transferred linearly in the Y-axis direction.

There is disposed a temporary storage area 12 between the storage cassette 8 and the loading/unloading unit 10 to temporarily place the frame unit 17 for loading or unloading.

The temporary storage area 12 has a pair of positioning members 14 for centering the annular frame F of the frame unit 17. A transfer unit 16 provided near the temporary storage area 12 has a swing arm for transferring the frame unit 17 under suction. The frame unit 17 unloaded onto the temporary storage area 12 is transferred onto the chuck table 18 under suction by the transfer unit 16. The frame unit 17 is held under suction on a suction holding section 19 of the chuck table 18, and the annular frame F is secured in place by clamping with a plurality of frame clamps 21.

The chuck table 18 can rotate and travel back and forth in the X-axis direction, and an alignment unit 20 for detecting the target street of the wafer W is disposed upward in the traveling path of the chuck table 18 running in the X-axis direction. The alignment unit 20 includes an imaging unit 22 having an imaging element for imaging the face side of the wafer W and a microscope. The target projected cutting line can be detected based on the image obtained by imaging through image processing such as pattern matching. The image obtained by the imaging unit 22 appears on the display unit 6.

A cutting unit 24 for cutting the wafer W held on the chuck table 18 is disposed on the left of the alignment unit 20. The cutting unit 24 is integral with the alignment unit 20 so that the two units travel in the Y-axis and Z-axis directions together. The cutting unit 24, composed of a rotatable spindle 26 and a cutting blade 28 attached at the tip of the spindle 26, can travel in the Y-axis and Z-axis directions. The cutting blade 28 is located on the line extending in the X-axis direction from the imaging unit 22.

Reference numeral 25 is a transfer unit for transferring the frame unit 17 under suction to a spinner cleaning unit 27. The spinner cleaning unit 27 cleans and dries the frame unit 17 by spinning.

Figure 2:
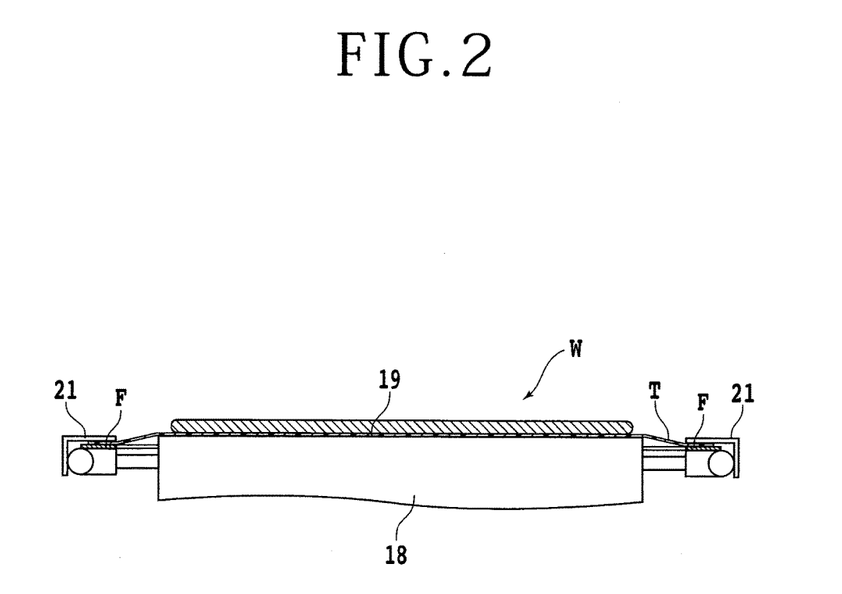
FIG. 2 is a partial sectional side view depicting a holding step.

The wafer processing method according to the present embodiment using the above cutting apparatus 2 will be described. This wafer processing method carries out the holding step of holding the wafer W on the suction holding section 19 of the chuck table 18 with the face side of the wafer W exposed, as depicted in FIG. 2. The annular frame F is secured in place by clamping with the frame clamps 21. While the wafer W is held on the chuck table 18 in this manner, the cutting step of cutting the wafer W along the projected cutting lines 13 is carried out by the cutting blade. The cutting step according to the first embodiment will be described with reference to FIG. 3.

The cutting unit 24 includes a spindle 26 rotatably accommodated in a spindle housing 30 and the cutting blade 28 detachably fitted to the tip of the spindle 26. A blade cover 32 schematically covering half of the cutting blade 28 is attached to the spindle housing 30. A pair of blade cooler nozzles 34 (only one thereof is depicted) extending horizontally along both sides of the cutting blade 28 are attached to the blade cover 32. The blade cooler nozzle 34 communicates with connecting pipes 36 which are connected to a supply source, not depicted, of high resistivity cutting water composed of pure water.

Connecting pipes 38 and 40 are further attached to the blade cover 32. The connecting pipe 38 communicates with a shower nozzle, not depicted, for supplying cutting water to the cutting edge of the cutting blade 28. The connecting pipe 38 is also connected to the supply source, not depicted, of high resistivity cutting water composed of pure water. On the other hand, the connecting pipe 40 communicates with a pair of spray nozzles 42 for supplying cutting water and cleaning the face side of the wafer W. The connecting pipe 40 is connected to a supply source, not depicted, of low resistivity cutting water prepared by blowing carbon dioxide into pure water.

Further, in the present embodiment, a pipe 44 for supplying low resistivity cutting water during cutting of the wafer W is disposed in such a manner as to extend in a direction perpendicular to the X1 direction, the processing feed direction. The pipe 44 has a plurality of ejection ports for ejecting low resistivity cutting water 45. The term "high resistivity" here is approximately 1 MΩ·cm, resistivity of pure water, and the term "low resistivity" is in the range from 0.1 to 0.5 MΩ·cm.

In the cutting step according to the present embodiment, while high resistivity cutting water composed of pure water is supplied from the blade cooler nozzles 34 and the shower nozzle, not depicted, and low resistivity cutting water prepared by blowing carbon dioxide into pure water is supplied from the spray nozzles 42 and the pipe 44, the cutting blade 28 is lowered into the projected cutting line 13 of the wafer W until the dicing tape T is reached, cutting the wafer W while the chuck table 18 holding the frame unit 17 is fed for processing in the direction depicted by an arrow X1.

During cutting of the wafer W, cutting is carried out while high resistivity cutting water composed of only pure water is supplied to the cutting blade 28 from the blade cooler nozzles 34 and the shower nozzle, not depicted, thereby preventing corrosion of the cutting blade 28 and preventing shorter life of the cutting blade 28.

On the other hand, cutting is carried out while low resistivity cutting water, prepared by blowing carbon dioxide into pure water having a resistivity lower than cutting water supplied to the cutting blade, is supplied to the face side of the wafer W from the spray nozzles 42 and the pipe 44. This effectively prevents charging of the devices 15 formed on the wafer W, prevents their electrostatic breakdown, and keeps them free from adhesion of contaminants.

Figure 4:
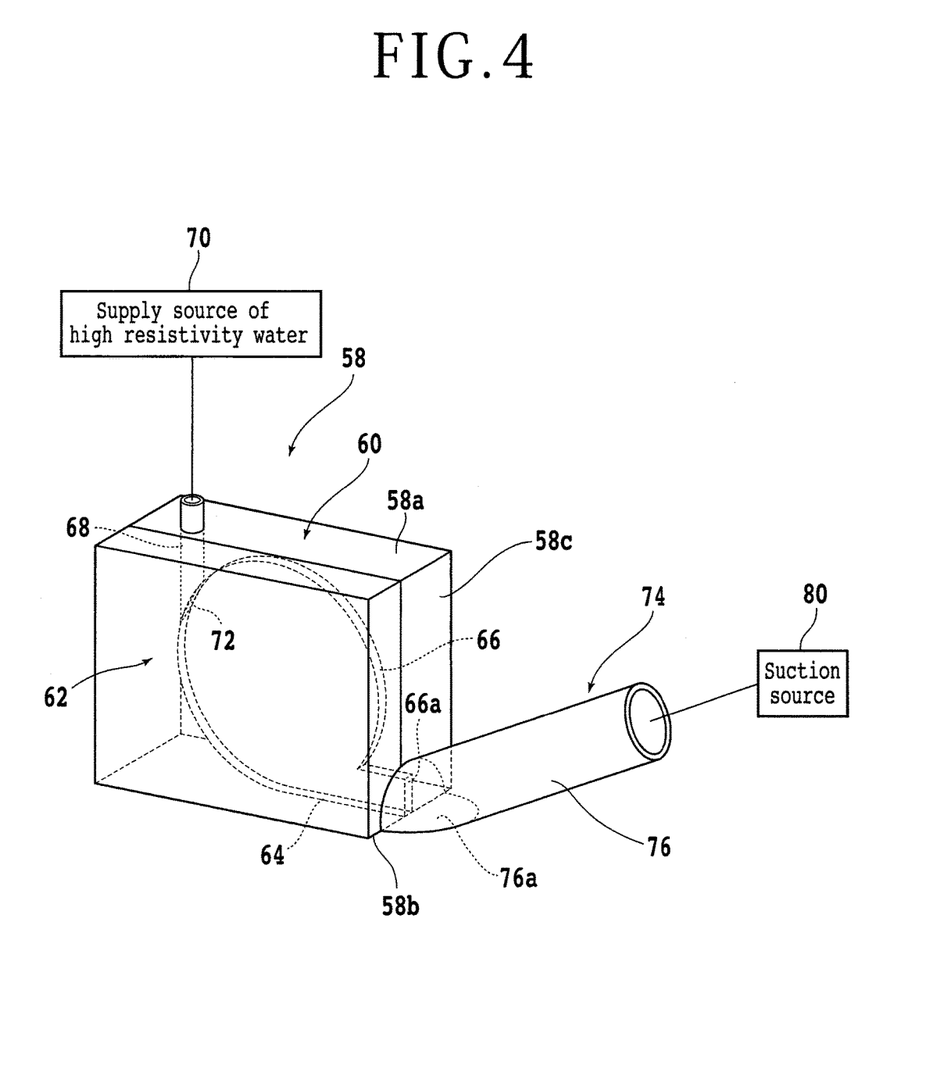
FIG. 4 is a perspective view of a blade cover of a second embodiment.
Figure 5:
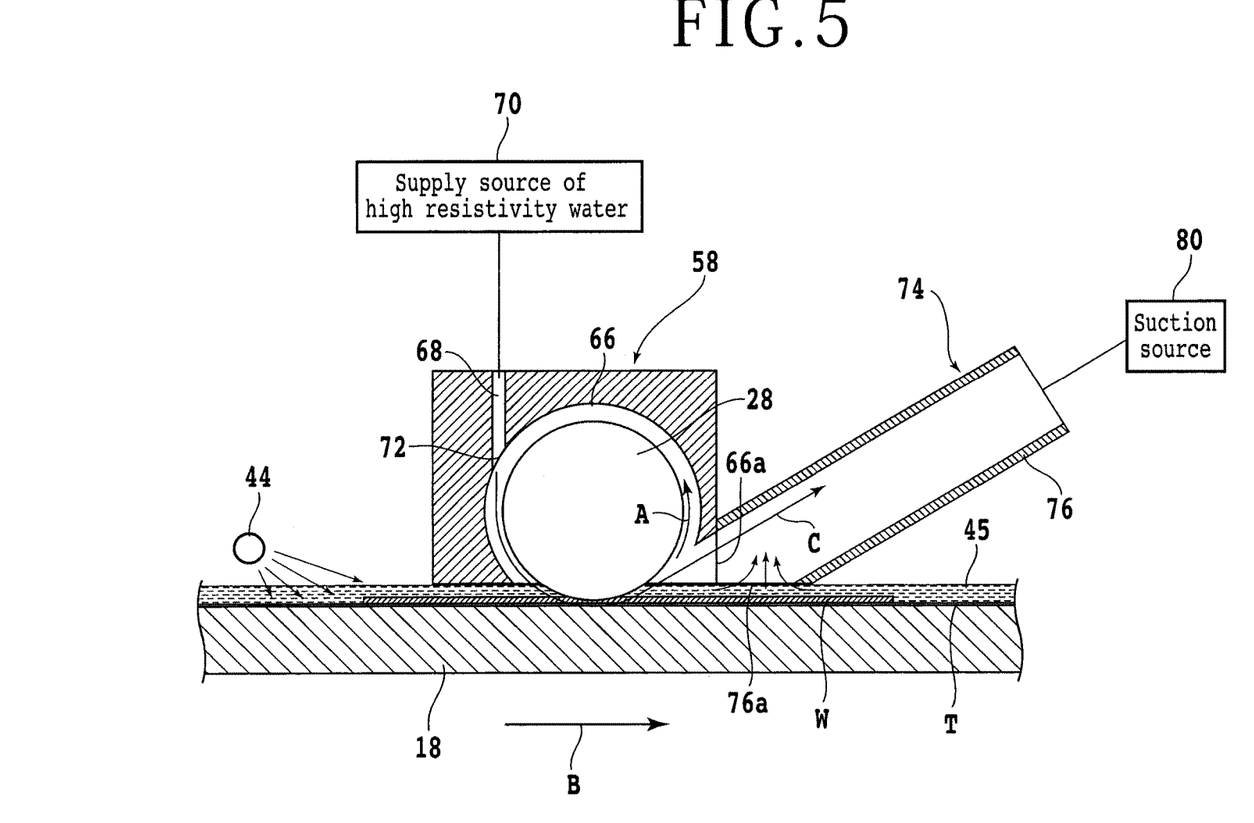
FIG. 5 is a vertical sectional view depicting a cutting step using the blade cover of the second embodiment.

The wafer processing method using the cutting apparatus according to a second embodiment of the present invention having a blade cover 58 as depicted in FIGS. 4 and 5 will be described next. As depicted in FIG. 4, the blade cover 58 includes a first cover 60 and a second cover 62 detachably fixed to the first cover 60, for example, with fastening screws or the like. The blade cover 58 includes a ceiling portion 58a, a bottom portion 58b having an opening 64 from which the tip of the cutting blade 28 protrudes and opposed to the ceiling portion 58a, and a side wall portion 58c adapted to connect the ceiling portion 58a and the bottom portion 58b.

The blade cover 58 defines a space portion 66 into which the cutting blade 28 is inserted, thereby covering the cutting blade 28 with the blade cover 58 except for the tip of the cutting blade 28 serving as a processing point projecting from the opening 64. The blade cover 58 has a cutting water supply channel 68. One end of the cutting water supply channel 68 is connected to a supply source 70 of high resistivity cutting water composed of pure water, and an ejection port 72 for ejecting cutting water into the space portion 66 into which the cutting blade 28 is inserted is formed at the other end. The cutting water supply channel 68, the cutting water supply source 70, and the ejection port 72 form cutting water supply means.

Reference numeral 74 is waste water recovery means which includes an inflow channel (tubular body) 76 having its one end connected to the side wall portion 58c of the blade cover 58 and attached to be tilted at a predetermined angle and a suction source 80 connected to the other end of the tubular body 76. The tilting angle of the inflow channel (tubular body) 76 is preferably 30° or less with respect to the holding surface 19 of the chuck table 18. The smaller the tilting angle, the more stably continuous suction can be carried out by the suction source 80. The waste water recovery means 74 is disposed on the side where cutting water supplied to the cutting blade 28 flies as a result of rotation of the cutting blade 28.

The operation of the above second embodiment will be described next with reference to FIG. 5. The wafer W, a workpiece, is held under suction on the chuck table 18 in the form of the frame unit 17 supported by the annular frame F via the dicing tape T.

In the cutting step, the cutting blade 28 rotating at a high speed of approximately 30000 rpm in the direction depicted by an arrow A cuts into the projected cutting line 13 of the wafer W until the dicing tape T is reached, and the chuck table 18 is fed for processing in the direction depicted by an arrow B while high resistivity cutting water is supplied to the cutting blade 28 via the cutting water supply channel 68 as depicted in FIG. 5, thereby carrying out cutting along the aligned projected cutting line 13.

In cutting along the projected cutting lines 13 with the cutting blade 28, the low resistivity cutting water 45 prepared by blowing carbon dioxide into pure water is supplied from the low resistivity cutting water supply pipe 44, thereby filling the space between the wafer W held on the chuck table 18 and the bottom of the blade cover 58 with the cutting water 45 and carrying out cutting of the wafer W along the projected cutting line 13 while high resistivity cutting water is ejected to the cutting edge of the cutting blade 28 from the ejection port 72.

Part of cutting dust produced by cutting rotates together with cutting water with rotation of the cutting blade 28, and part of cutting water containing cutting dust is taken into the inflow channel (tubular body) 76 of the waste water recovery means 74 via a suction port 66a formed in the side wall portion 58c of the blade cover 58 as depicted by an arrow C and removed under suction as the suction source 80 is activated.

The ejection port 72 is disposed upstream of the cutting water flow and formed such that cutting water supplied to the cutting blade 28 is ejected tangentially to the perimeter of the cutting blade 28, thereby allowing effective discharge of waste water containing cutting dust without hindering the flow of cutting water containing cutting dust that rotates with rotation of the cutting blade 28.

On the other hand, the remaining cutting dust produced by cutting but not taken during cutting remains floating in the low resistivity cutting water 45. Part of this cutting water 45 is taken into the inflow channel (tubular body) 76 of the waste water recovery means 74 via an opening 76a and removed from the wafer W under suction as the suction source 80 is activated.

In the cutting apparatus according to the present embodiment having the blade cover 58, high resistivity cutting water is supplied to the cutting blade 28 via the cutting water supply channel 68, low resistivity cutting water, prepared by blowing carbon dioxide into pure water, is supplied to the front face of the wafer W from the low resistivity cutting water supply pipe 44, and the wafer W is immersed in the low resistivity cutting water 45 with a resistivity lower than that of cutting water supplied to the cutting blade during cutting of the wafer W.

Accordingly, this prevents corrosion of the cutting blade 28, thereby preventing shorter life of the cutting blade 28. Additionally, the wafer W is immersed in the low resistivity cutting water 45, thereby preventing charging of the devices 15, preventing their electrostatic breakdown, and keeping them free from adhesion of contaminants.

The present invention is not limited to the details of the above described preferred embodiments. The scope of the invention is not defined by the appended claims and all changes and modifications as fall within the equivalence of the scope of the claims are therefore to be embraced by the invention.

What is claimed is:

1. A wafer processing method for processing a wafer, the wafer having, on a face side, a device formed in each of areas demarcated by a plurality of crossing projected cutting lines, the wafer processing method comprising:
   a holding step of holding the wafer on a chuck table with the face side exposed; and
   a cutting step of cutting the wafer held on the chuck table along the projected cutting lines with a cutting blade, wherein
   in the cutting step, cutting is carried out while cutting water with a low resistivity is supplied to the face side of the wafer and cutting water with a high resistivity is supplied to the cutting blade.

2. A cutting apparatus comprising:
   a chuck table configured to hold a wafer, the wafer having a plurality of devices; and
   a cutting blade configured to cut the wafer held on the chuck table;
   at least one low resistivity cutting water supply nozzle configured to supply cutting water with a low resistivity to a face side of the wafer; and
   at least one high resistivity cutting water supply nozzle configured to supply cutting water with a high resistivity to the cutting blade,
   wherein the at least one low resistivity cutting water supply nozzle comprises a pipe, having a plurality of ejection ports, and
   wherein the pipe is disposed such that its axis is perpendicular to the plane of the cutting blade, and the plurality of ejection ports are configured to supply cutting water in a direction substantially parallel to the plane of the blade.

3. The cutting apparatus of claim 2, wherein the at least one high resistivity cutting water supply nozzle comprises:
   a pair of blade cooler nozzles, each nozzle extending parallel to the wafer, each blade cooler nozzle of the pair of blade cooler nozzles being disposed on an opposing side of the cutting blade.

4. The cutting apparatus of claim 2, wherein said blade has a cover, and wherein the at least one low resistivity cutting water supply nozzle comprises:
   a pair of cutting water supply nozzles disposed on the blade cover.

5. The wafer processing method of claim 1, wherein the cutting water with low resistivity is supplied by at least one nozzle.

6. The wafer processing method of claim 1, wherein the cutting water with high resistivity is supplied by at least one nozzle.

7. The wafer processing method of claim 5, wherein the blade has a blade cover, and wherein the at least one nozzle comprises:
   a pair of cutting water supply nozzles disposed on the blade cover.

8. The wafer processing method of claim 5, wherein the at least one nozzle comprises:
   a pipe, having a plurality of ejection ports.

9. The wafer processing method of claim 8, wherein the pipe is disposed such that its axis is perpendicular to the plane of the cutting blade, and the plurality of ejection ports are configured to supply cutting water in a direction substantially parallel to the plane of the blade.

10. The cutting apparatus according to claim 2, wherein said at least one low resistivity cutting water supply nozzle is connected to a supply of low resistivity cutting water, and said at least one high resistivity cutting water supply nozzle is connected to a supply of high resistivity cutting water.

11. The cutting apparatus according to claim 10, wherein said at least one low resistivity cutting water supply nozzle and said at least high resistivity cutting water nozzle are operated simultaneously.

12. The wafer processing method of claim 1, wherein:
   the cutting water with a low resistivity is in the range of 0.1 to 0.5 MΩ·cm; and
   the cutting water with a high resistivity has approximately 1 MΩ·cm.

\* \* \* \* \*